US006798317B2

(12) United States Patent
Silk et al.

(10) Patent No.: US 6,798,317 B2
(45) Date of Patent: Sep. 28, 2004

(54) VERTICALLY-STACKED FILTER EMPLOYING A GROUND-APERTURE BROADSIDE-COUPLED RESONATOR DEVICE

(75) Inventors: Seth David Silk, Barrington, IL (US); Stephen Kuffner, Algonquin, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/179,780

(22) Filed: Jun. 25, 2002

(65) Prior Publication Data

US 2003/0234706 A1 Dec. 25, 2003

(51) Int. Cl.[7] .................................................. H03H 7/00
(52) U.S. Cl. ........................ 333/185; 333/204; 333/246
(58) Field of Search ................................ 333/185, 175, 333/204, 205, 219, 246

(56) References Cited

U.S. PATENT DOCUMENTS

| | | | | | |
|---|---|---|---|---|---|
| 3,451,015 | A | * | 6/1969 | Heath | 333/204 |
| 4,701,727 | A | * | 10/1987 | Wong | 333/204 |
| 5,093,639 | A | * | 3/1992 | Franchi et al. | 333/246 |
| 5,311,159 | A | * | 5/1994 | Miura et al. | 333/204 |
| 5,349,314 | A | * | 9/1994 | Shimizu et al. | 333/204 |
| 5,374,909 | A | * | 12/1994 | Hirai et al. | 333/204 |
| 5,691,676 | A | * | 11/1997 | Snel et al. | 333/204 |
| 5,742,210 | A | * | 4/1998 | Chaturvedi et al. | 333/116 |
| 5,949,304 | A | * | 9/1999 | Heine et al. | 333/175 |
| 6,294,967 | B1 | * | 9/2001 | Hirai et al. | 333/202 |
| 6,304,156 | B1 | * | 10/2001 | Ishizaki et al. | 333/204 |
| 6,437,665 | B1 | * | 8/2002 | Kato | 333/204 |
| 6,538,534 | B2 | * | 3/2003 | Hirai et al. | 333/204 |

OTHER PUBLICATIONS

"*Multilayer Asymmetric Aperture–Coupled Broadside Microstrip Lines and Their Quasi–Static and Dynamic Analysis*": Subbarao Kunasani, Cam Nguyen, IEEE Transactions on Microwave Theory and Techniques, vol. 43, No. 12, Dec. 1995 pp. 2702–2707.

"*Stripline to Microstrip Line Aperture Coupler*": G. V. Jogiraju, V. M. Pandharipande; IEEE Transactions on Microwave Theory and Techniques, vol. 38, No. 4, Apr. 1990 pp. 440–443.

"*Coupled–Transmission–Line Directional Couplers*", J. K. Shimizu and E. M. T. Jones, Oct. 1958, pp. 403–410.

* cited by examiner

*Primary Examiner*—Robert Pascal
*Assistant Examiner*—Kimberly Glenn
(74) *Attorney, Agent, or Firm*—Kenneth A. Haas

(57) ABSTRACT

A vertically-stacked filter employing a ground-aperture broadside-coupled resonator device that can advantageously be employed within various systems (e.g., communication systems). The filter comprises a plurality of metal layers and a plurality of dielectric layers arranged in a vertically-stacked topology. The plurality of metal layers form a resonator device having two or more resonators. At least one pair of resonators have opposing broadside surfaces that are coupled. One mechanism for broadside coupling the pair of resonators is a metal layer between the pair of resonators wherein the metal layer has an aperture between the broadside surfaces.

19 Claims, 10 Drawing Sheets

80

-PRIOR ART-

-PRIOR ART-

VERTICALLY-STACKED FILTER EMPLOYING A GROUND-APERTURE BROADSIDE-COUPLED RESONATOR DEVICE

FIELD OF THE INVENTION

The present invention generally relates to various resonating configurations of filters employing a resonator device. More specifically, the present invention relates to various topologies for filters employing a resonator device.

BACKGROUND OF THE INVENTION

Conventional strip-line filters known in the art employ planar resonator devices. FIG. 28 illustrates a top view of a known edge-coupled three resonator device 110 including a left resonator 111, a middle resonator 112, and a right resonator 113. The resonators 111–113 are aligned along their edges whereby the resonators 111 and 112 are edge-coupled, and the resonators 112 and 113 are edge-coupled. The edge-couplings of the resonators 111–113 establish a signal path from an input port 111*a* to an output port 113*a* as indicated by the arrow.

FIG. 29 illustrates a top view of a known two resonator device 120 employed within a parallel coupled line filter. A resonator 122 and a resonator 123 are approximately $\lambda/2$ long. An input line 121 is edge-coupled to the resonator 122 by a gap GP1. The resonator 122 is edge-coupled to the resonator 123 by a gap GP2. Finally, the second resonator 123 is edge-coupled to an output line 124 by gap GP3. The aforementioned edge-couplings establish a signal path from the input line 121 to the output line 124 as indicated by the arrows.

One drawback of the resonator device 110 and the resonator device 120 is a failure to facilitate a fabrication of a filter employing the resonator device within a minimal substrate area. The present invention is an advancement of the prior art.

SUMMARY OF THE INVENTION

One form of the present invention is a filter comprising a plurality of metal layers and a plurality of dielectric layers arranged in a vertically stacked topology. A first metal layer includes a first resonator. A second metal layer includes a second resonator.

The filter can employ a third metal layer including an inner ground operable to broadside couple the first resonator and the second resonator.

The filter can employ a third metal layer including an inner ground having an aperture operable to couple a broadside surface of the first resonator and a broadside surface of the second resonator.

The filter can employ a pair of strip-line regions formed by the metal layers. An input port of the first resonator is isolated within a first strip-line region. An output port of the second resonator is isolated within a second strip-line region.

The foregoing forms and other forms as well as features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

DETAILED DESCRIPTION OF THE PRESENTLY PREFERRED EMBODIMENTS

Figure 1:
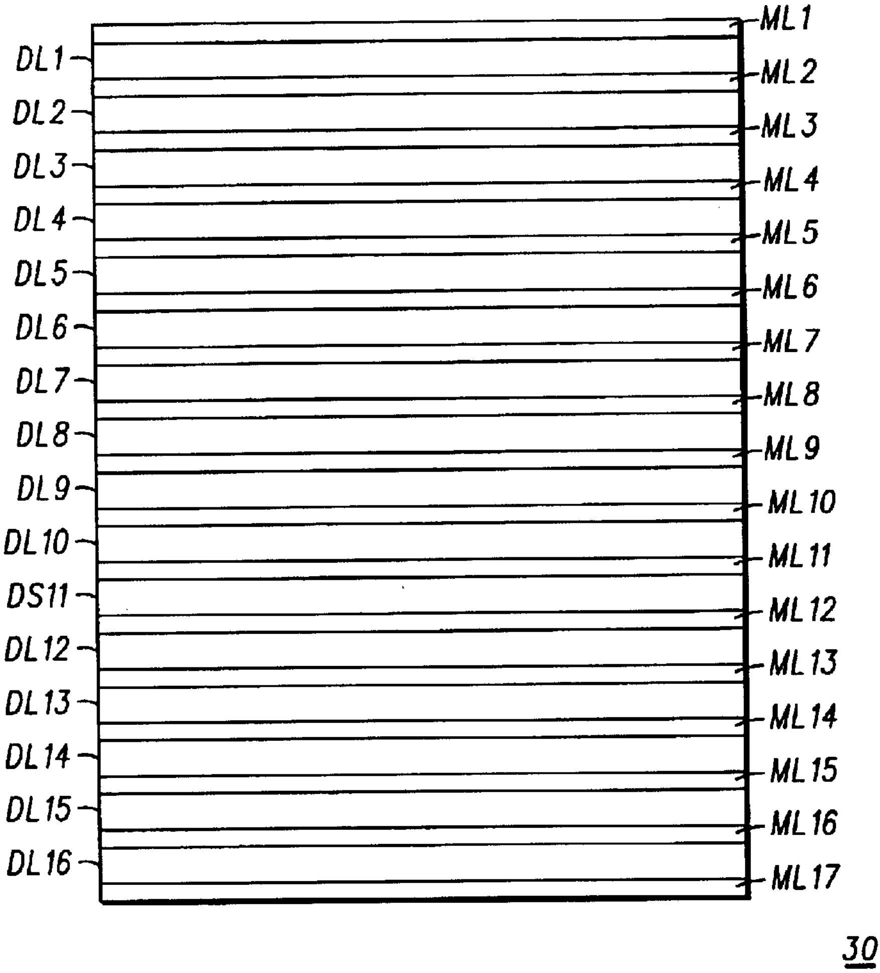
FIG. 1 illustrates a side view of one embodiment of a vertically stacked structure in accordance with the present invention.

FIG. 1 illustrates a structure 30 having seventeen (17) metal layers ML1–L17, and sixteen (16) dielectric layers DL1–DL16 arranged in a vertical stacked topology. The structure 30 serves as a basis for an understanding of a design of an $n^{th}$ order filter in accordance with the present invention. The number of designs of each $n^{th}$ order filter in accordance with the present invention is essentially limitless, and the structure 30 is therefore not a limitation as to the scope of an $n^{th}$ filter in accordance with the present invention. In particular, the thickness of the dielectric layers DL1–DL16 are shown as being 1.5 times thicker than the thickness of the metal layers ML1–ML17 only for purposes of visually distinguishing the various layers. From the description below, those having ordinary skill in the art will appreciate a proper dimensioning of the layers that is suitable for the desired functionality of a filter in accordance with the present invention.

As to the structure 30, the metal layer ML1 serves as a top ground and the metal layer ML17 serves as a bottom ground. An incorporation of a resonator device within the structure 30 in accordance with present invention involves an employment of three or more of the metal layers ML2–ML16 as components of the resonator device with the remaining unused metal layers being omitted from the structure 30. When employed as a component of a resonator device, a metal layer (ML2–ML16) includes either one or more resonators, one or more inner grounds, and/or dielectric material as will be further described in connection with the subsequent illustration and description of exemplary embodiments of filters in accordance with the present invention.

Figure 2:
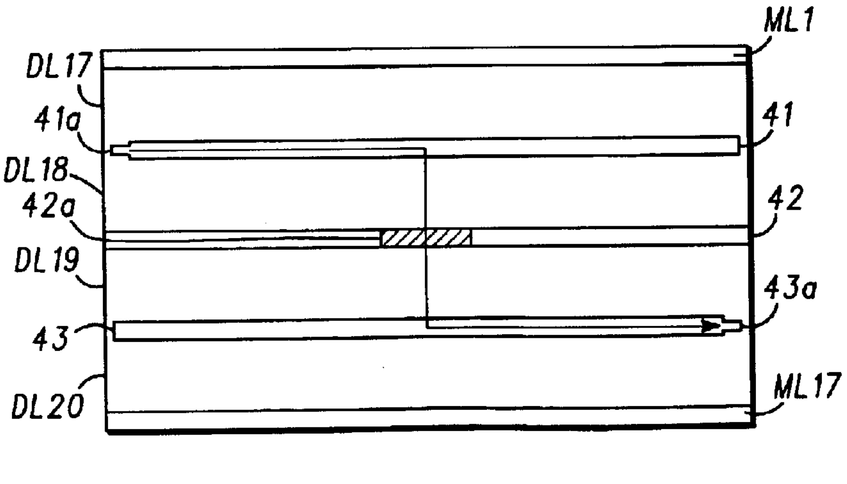
FIG. 2 illustrates a side view of the end edges of various layers of a first embodiment of a $2^{nd}$ order filter in accordance with the present invention.

FIG. 2 illustrates a $2^{nd}$ order filter 40 of the present invention employing a resonator device including a top resonator 41 having an input port 41*a*, an inner ground 42 having an aperture 42*a*, and a bottom resonator 43 having an output port 43*a*. As related to FIG. 1, a dielectric layer DL17 consists of the dielectric layers DL1–DL4 with an omission of the metal layers ML2–ML4. The metal layer ML5 includes the top resonator 41. A dielectric layer DL18 consists of the dielectric layers DL5–DL8 with an omission of the metal layers ML6–ML8. The metal layer ML9 includes the inner ground 42. A dielectric layer DL19 consists of the dielectric layers DL9–DL12 with an omission of the metal layers ML10–ML12. The metal layer ML13 includes the bottom resonator 43. A dielectric layer DL20 consists of the dielectric layers DL13–DL16 with an omission of the metal layers ML14–ML16.

The filter 40 can be fabricated from various techniques known in the art. In one embodiment, the filter 40 is fabricated from a multilayer ceramic fabrication technique or a monolithic integrated form fabrication technique involving known refinements, modifications, and enhancements of the filter 40 whereby, as illustrated in FIG. 2, (1) dielectric material from the dielectric layers DL17 and DL18 surround the top resonator 41, (2) dielectric material from the dielectric layers DL18 and DL19 fill the aperture 42*a*, and (3) dielectric material from the dielectric layers DL19 and DL20 surround the bottom resonator 43.

The aperture 42*a* couples a downward facing broadside surface (not shown) of the top resonator 41 and an upward facing broadside surface (not shown) of the bottom resonator 43. The broadside-coupling of the resonators 41 and 43 establishes a signal path from the input port 41*a* to the output port 43*a* as indicated by the arrow.

The area of the filter 40 between the top ground ML1 and the inner ground 42 constitutes a self-shielded stripline environment having the input port 41*a* therein. The area of the filter 40 between the inner ground 42 and the bottom ground ML17 constitutes an additional self-shielded stripline environment having the output port 43*a* therein. This arrangement of stripline environments provides an operational isolation of the input port 41*a* and an operational isolation of the output port 43*a*.

Figure 3:
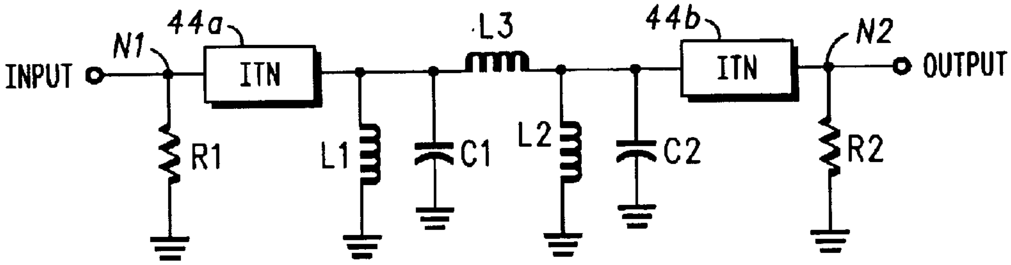
FIG. 3 illustrates a schematic of one embodiment of an equivalent lumped-element circuit forming resonating devices employed within the FIG. 2 filter.

FIG. 3 illustrates an equivalent lumped-element circuit of the resonator device employed within the filter 40 (FIG. 2). A node N1 is representative of the input port 41*a* having an input load represented by a resistor R1 and a conventional impedance transforming network ("ITN") 44*a*. An inductor L1 and a capacitor C1 are representative of the top resonator 41. An inductor L2 and a capacitor C2 are representative of the bottom resonator 43. An inductor L3 is representative of a broadside coupling of the top resonator 41 and the bottom resonator 43 facilitated by the aperture 42*a* of the inner ground 42. A node N2 is representative of the output port 43*a* having an output load represented by a resistor R2 and a conventional impedance transforming network ("ITN") 44*b*.

Figure 4:
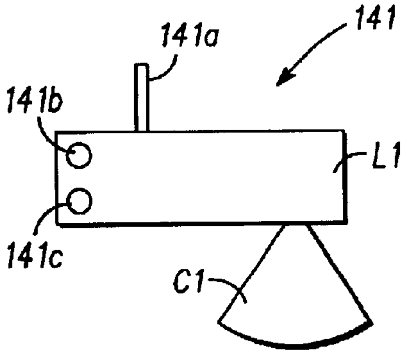
FIGS. 4–6 illustrates an upper broadside view of a first resonator device employed within the FIG. 2 filter in accordance with the present invention.
Figure 5:
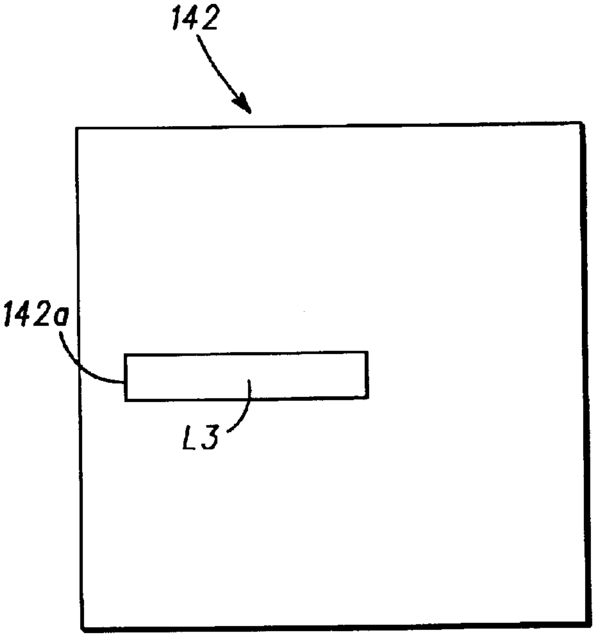
Figure 6:
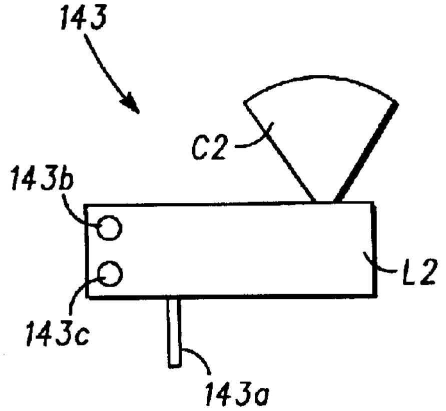

FIGS. 4–6 illustrate an upper broadside view of a resonating configuration 141 of the top resonator 41 (FIG. 2), a ground configuration 142 of the inner ground 42 (FIG. 2), and a resonating configuration 143 of the bottom resonator 43 (FIG. 2), respectively. The resonating configuration 141 includes a transmission line grounded at one end to develop an inductive portion corresponding to the inductor L1 (FIG. 3) and an open circuited stub to develop a capacitive portion corresponding to the capacitor C1 (FIG. 3). The resonating configuration 141 further includes an input port 141*a* corresponding to the input port 41*a* (FIG. 2), and a pair connections 141*b* and 141*c*, known in the art as vias, for facilitating a grounding of the inductive portion L1. In this embodiment, the input port 141*a* is a direct-connection tap on the transmission line L1, where the tap location determines the loaded Q of the resonator device. Those having ordinary skill in the art will appreciate other conventional techniques for designing the input port 141*a* of the resonating configuration 141.

As with the resonating configuration 141, the resonating configuration 143 includes a transmission line grounded at one end to develop an inductive portion corresponding to the inductor L2 (FIG. 3) and an open circuited stub to develop a capacitive portion corresponding to the capacitor C2 (FIG. 3). The resonating configuration 143 further includes an output port 143*a* corresponding to the output port 43*a* (FIG. 2), and a pair of vias 143*b* and 143*c* for facilitating a grounding of the inductive portion L2. In this embodiment, the output port 143*a* is a direct-connection tap on the transmission line L2, where the tap location determines the loaded Q of the resonator device. Those having ordinary skill in the art will appreciate other conventional techniques for designing the input port 143*a* of the resonating configuration 143.

The ground configuration 142 includes an aperture 142*a* corresponding to the aperture 42*a* (FIG. 2) and the inductor L3 (FIG. 3). The aperture 142*a* facilitates a coupling of a portion of a lower broadside surface (not shown) of the inductor portion L1 of the resonating configuration 141 and a portion of the upper broadside surface (shown) of the inductor portion L2 of the resonating configuration 143. In this embodiment, the top ground ML1 (FIG. 2) and the bottom ground ML17 (FIG. 2) preferably have the same dimensions as the ground configuration 142 with the omission of the aperture 142*a*.

Figure 7:
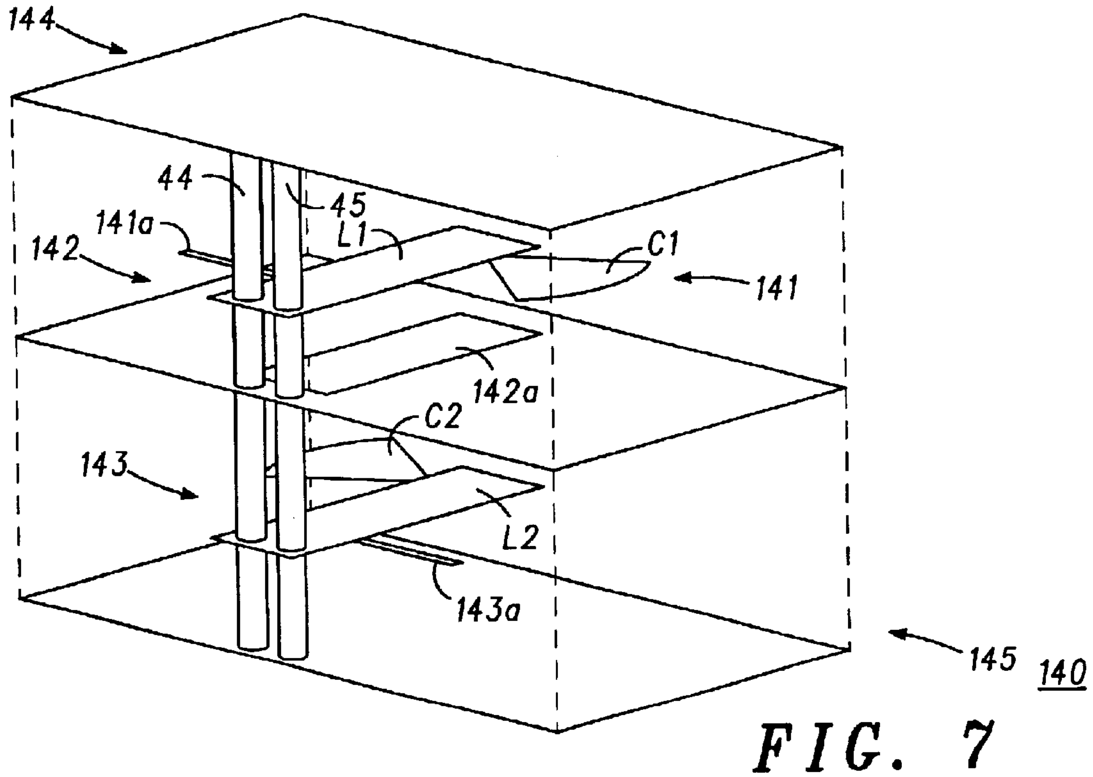
FIG. 7 illustrates a perspective view of the upper broadside view of the FIGS. 4–6 resonator device.

FIG. 7 illustrates a three-dimensional rendering of a broadside coupling of the resonating configuration 141 and the resonating configuration 143 via the aperture 142*a* within a substrate area 140 of the filter 40 (FIG. 2). Specifically, the aperture 142*a* facilitates a coupling of a downward facing broadside surface (not shown) of the inductor portion L1 of the resonating configuration 141 and an upward facing broadside surface (shown) of the inductor portion L2 of the resonating configuration 143. Successive vias through the dielectric layers forming a via stack 44 connects vias 141*b* and 143*b*, and successive vias through the dielectric layers forming a via stack 45 connects vias 141*c* and 143*c* to thereby short the resonating configuration 141 and the resonating configuration 143 to the ground configuration 142 as well as a configuration 144 of the top ground ML1 (FIG. 2) and a configuration 145 of the bottom ground ML17 (FIG. 2).

Figure 8:
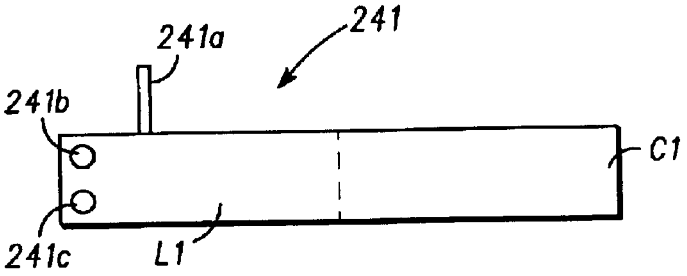
FIGS. 8–10 illustrates an upper broadside view of a second resonator device employed within the FIG. 2 filter in accordance with the present invention.
Figure 9:
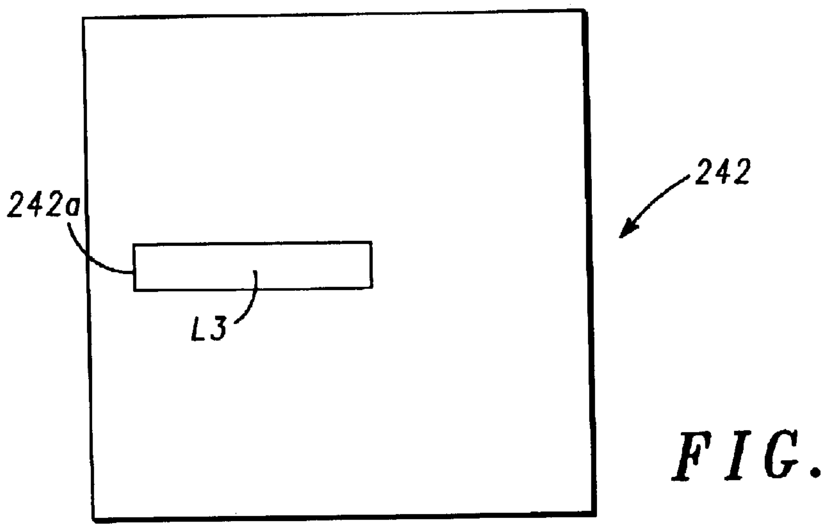
Figure 10:
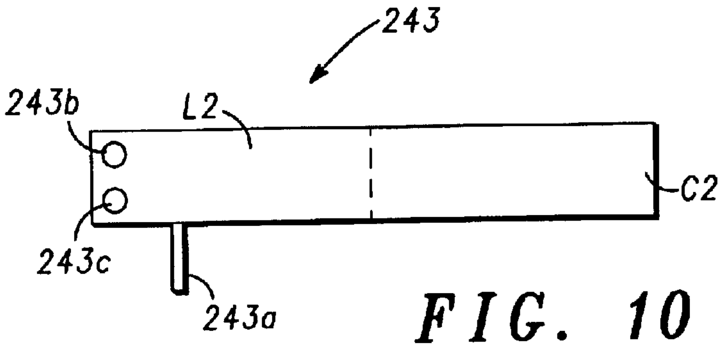

FIGS. 8–10 illustrate an upper broadside view of a resonating configuration 241 of the top resonator 41 (FIG. 2), a ground configuration 242 of the inner ground 42 (FIG. 2), and a resonating configuration 243 of the bottom resonator 43 (FIG. 2), respectively. The resonating configuration 241 includes a transmission line grounded at one end to develop an inductive portion corresponding to the inductor L1 (FIG. 3) and an open circuited stub with the same line-width as the transmission line to develop a capacitive portion corresponding to the capacitor C1 (FIG. 3). The resonating configuration 241 further includes an input port 241*a* corresponding to the input port 41*a* (FIG. 2), and a pair of vias 241*b* and 241*c* for facilitating a grounding of the inductive portion L1. In this embodiment, the input port 241*a* is a direct-connection tap on the transmission line L1, where the tap location determines the loaded Q of the resonator device. Those having ordinary skill in the art will appreciate other conventional techniques for designing the input port 241*a* of the resonating configuration 241.

As with the resonating configuration 241, the resonating configuration 243 includes a transmission line grounded at one end to develop an inductive portion corresponding to the inductor L2 (FIG. 3) and an open circuited stub with the same line-width as the transmission line to develop a capacitive portion corresponding to the capacitor C2 (FIG. 3). The resonating configuration 243 further includes an output port 243*a* corresponding to the output port 43*a* (FIG. 2), and a pair of vias 243*b* and 243*c* for facilitating a grounding of the inductive portion L2. In this embodiment, the output port 243*a* is a direct-connection tap on the transmission line L2, where the tap location determines the loaded Q of the resonator device. Those having ordinary skill in the art will appreciate other conventional techniques for designing the input port 243*a* of the resonating configuration 243.

The ground configuration 242 includes an aperture 242*a* corresponding to the aperture 42*a* (FIG. 2) and the inductor L3 (FIG. 3). The aperture 242*a* facilitates a coupling of a portion of a lower broadside surface (not shown) of the inductor portion L1 of the resonating configuration 241 and a portion of the upper broadside surface (shown) of the inductor portion L2 of the resonating configuration 243. In this embodiment, the top ground ML1 (FIG. 2) and the bottom ground ML17 (FIG. 2) preferably have the same dimensions as the ground configuration 242 with the omission of the aperture 242*a*.

Figure 11:
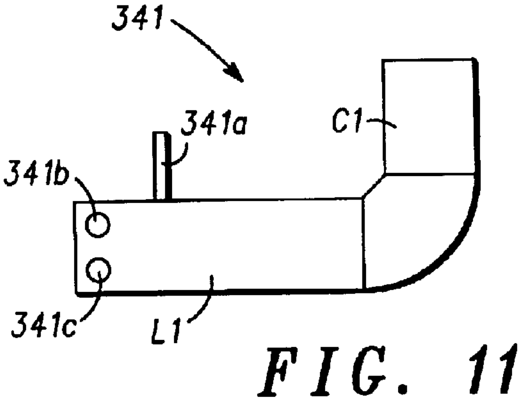
FIGS. 11–13 illustrates an upper broadside of a third resonator device employed within the FIG. 2 filter in accordance with the present invention.
Figure 13:
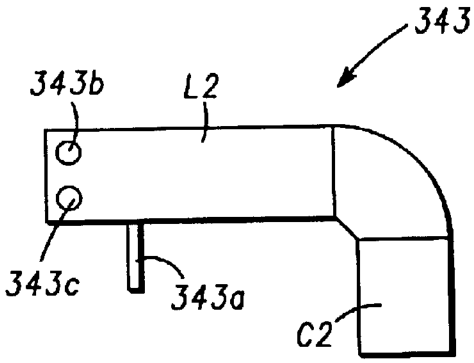
Figure 12:
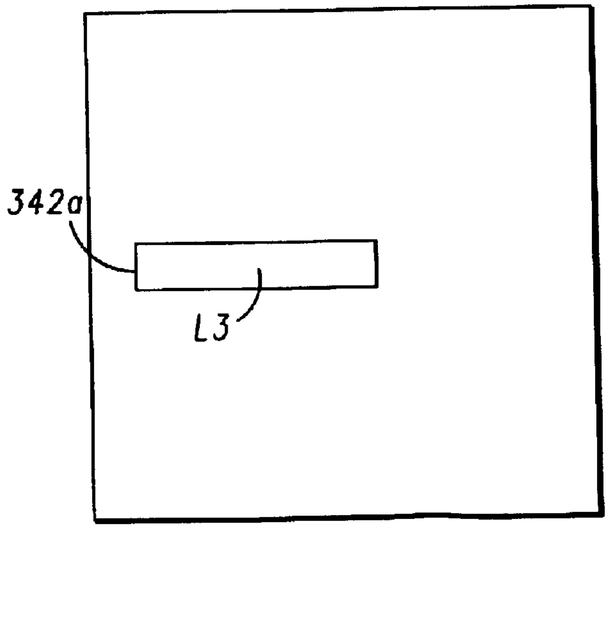

FIGS. 11–13 illustrate an upper broadside view of a resonating configuration 341 of the top resonator 41 (FIG. 2), a ground configuration 342 of the inner ground 42 (FIG. 2), and a resonating configuration 343 of the bottom resonator 43 (FIG. 2), respectively. The resonating configuration 341 includes a transmission line grounded at one end to develop an inductive portion corresponding to the inductor L1 (FIG. 3) and an open circuited stub with a meander to develop a capacitive portion corresponding to the capacitor C1 (FIG. 3). The resonating configuration 341 further includes an input port 341*a* corresponding to the input port 41*a* (FIG. 2), and a pair of vias 341*b* and 341*c* for facilitating a grounding of the inductive portion L1. In this embodiment, the input port 341*a* is a direct-connection tap on the transmission line L1, where the tap location determines the loaded Q of the resonator device. Those having ordinary skill in the art will appreciate other conventional techniques for designing the input port 341*a* of the resonating configuration 341.

As with the resonating configuration 341, the resonating configuration 343 includes a transmission line grounded at one end to develop an inductive portion corresponding to the inductor L2 (FIG. 3) and an open circuited stub with a meander to develop a capacitive portion corresponding to the capacitor C2 (FIG. 3). The resonating configuration 343 further includes an output port 343*a* corresponding to the output port 43*a* (FIG. 2), and a pair of vias 343*b* and 343*c* for facilitating a grounding of the inductive portion L2. In this embodiment, the output port 343*a* is a direct-connection tap on the transmission line L2, where the tap location determines the loaded Q of the resonator device. Those having ordinary skill in the art will appreciate other conventional techniques for designing the input port 343*a* of the resonating configuration 343.

The ground configuration 342 includes an aperture 342*a* corresponding to the aperture 42*a* (FIG. 2) and the inductor L3 (FIG. 3). The aperture 342*a* facilitates a coupling of a portion of a lower broadside surface (not shown) of the inductor portion L1 of the resonating configuration 341 and a portion of the upper broadside surface (shown) of the inductor portion L2 of the resonating configuration 343. In this embodiment, the top ground ML1 (FIG. 2) and the bottom ground ML17 (FIG. 2) preferably have the same dimensions as the ground configuration 342 with the omission of the aperture 342*a*.

Figure 14:
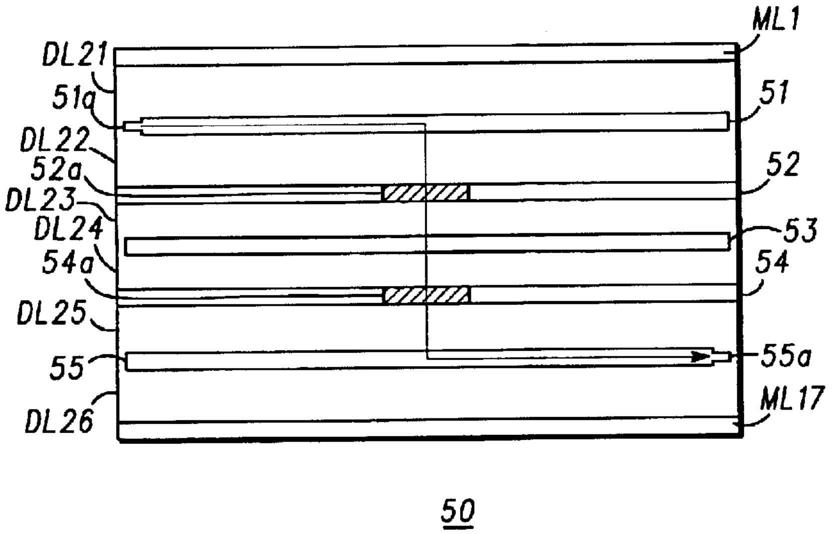
FIG. 14 illustrates a side view of the end edges of various layers of one embodiment of a $3^{rd}$ order filter in accordance with the present invention.

FIG. 14 illustrates a 3$^{rd}$ order filter 50 of the present invention employing a resonator device including a top resonator 51 having an input port 51*a*, an inner ground 52 having an aperture 52*a*, a middle resonator 53, an inner ground 54 having an aperture 54*a*, and a bottom resonator 55 having an output port 55*a*. As related to FIG. 1, a dielectric layer DL21 consists of the dielectric layers DL1–DL3 with an omission of the metal layers ML2 and ML3. The metal layer ML4 includes the top resonator 51. A dielectric layer DL22 consists of the dielectric layers DL4–DL6 with an omission of the metal layers ML5 and ML6. The metal layer ML7 includes the inner ground 52. A dielectric layer DL23 consists of the dielectric layers DL7 and DL8 with an omission of the metal layer ML8. The metal layer ML9 includes the middle resonator 53. A dielectric layer DL24 consists of the dielectric layers DL9 and DL10 with an omission of the metal layer ML10. The metal layer ML11 includes the inner ground 54. A dielectric layer DL25 consists of the dielectric layers DL11–DL13 with an omission of the metal layers ML12 and ML13. The metal layer ML14 includes the bottom resonator 55. A dielectric layer DL26 consists of the dielectric layers DL14–DL16 with an omission of the metal layers ML15 and ML16. The filter 50 can be fabricated from various techniques known in the art. In one embodiment, the filter 50 is fabricated in accordance with a multilayer ceramic fabrication technique or a monolithic integrated form fabrication technique involving known refinements, modifications, and enhancements of the filter 50 whereby, as illustrated in FIG. 14, (1) dielectric material from the dielectric layers DL21 and DL22 surround the top resonator 51, (2) dielectric material from the dielectric layers DL22 and DL23 fill the aperture 52*a* of the inner ground 52, (3) dielectric material from the dielectric layers DL23 and DL24 surround the middle resonator 53, (4) dielectric material from the dielectric layers DL24 and DL25 fill the aperture 54*a* of the inner ground 54, and (5) dielectric material from the dielectric layers DL25 and DL26 surround the bottom resonator 55.

A downward facing broadside surface (not shown) of the top resonator 51 and an upward facing broadside surface (not shown) of the middle resonator 53 are coupled through the aperture 52*a* of the inner ground 52. A downward facing broadside surface (not shown) of the middle resonator 53 and an upward facing broadside surface (not shown) of the bottom resonator 55 are coupled through the aperture 54*a* of the inner ground 54. The broadside-coupling of the resonators 51 and 53, and the broadside-coupling of the resonators 53 and 55 collectively establish a signal path from the input port 51*a* to the output port 53*a* as indicated by the arrows.

The area of the filter 50 between the top ground ML1 and the inner ground 52 constitutes a self-shielded stripline environment having the input port 51*a* therein. The area of the filter 50 between the inner ground 54 and the bottom ground ML17 constitutes an additional self-shielded stripline environment having the output port 55*a* therein. This arrangement of stripline environments provides an operational isolation of the input port 51*a* and an operational isolation of the output port 55*a*.

Figure 15:
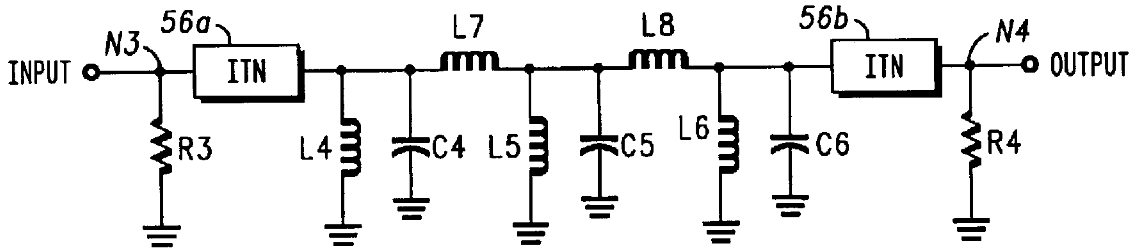
FIG. 15 illustrates a schematic of one embodiment of an equivalent lumped-element circuit forming resonating devices employed within the FIG. 14 filter.
Figure 16:
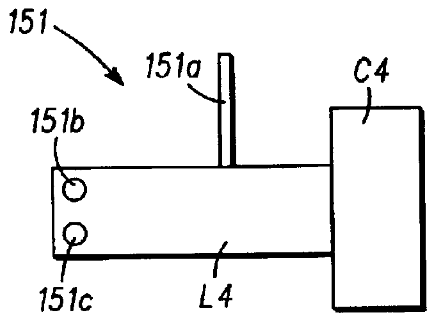
FIGS. 16–20 illustrates an upper broadside view of a resonator device employed within the FIG. 14 filter in accordance with the present invention.
Figure 17:
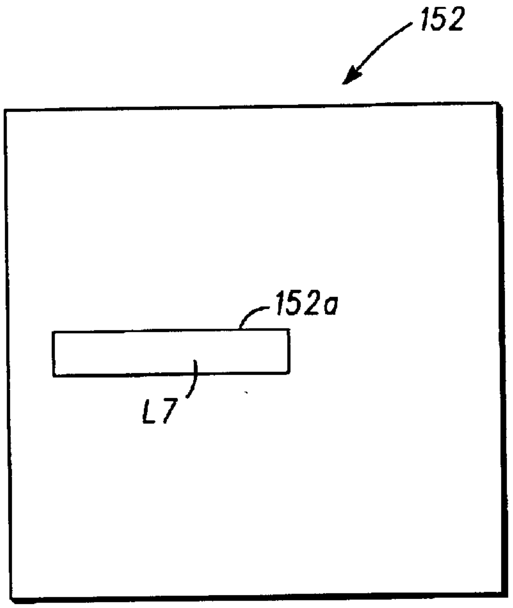
Figure 18:
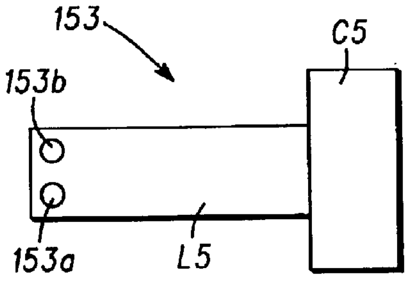
Figure 19:
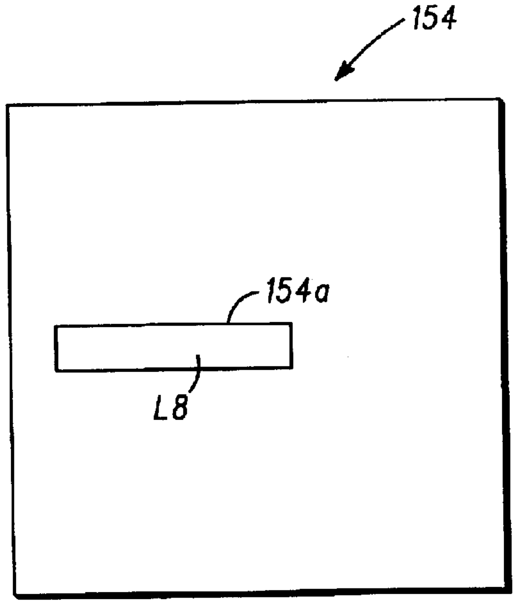
Figure 20:
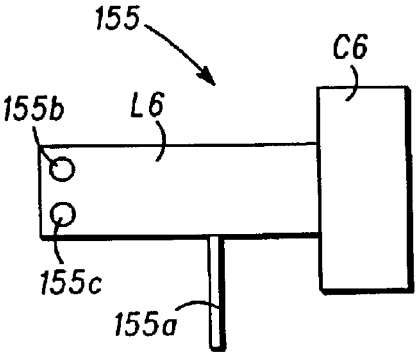

FIG. 15 illustrates an equivalent lumped-element circuit of the filter 50 (FIG. 14). A node N3 is representative of the input port 51*a* having an input load represented by a resistor R3 and a conventional impedance transforming network ("ITN") 56*a*. An inductor L4 and a capacitor C4 are representative of the top resonator 51. An inductor L5 and a capacitor C5 are representative of the middle resonator 53. An inductor L6 and a capacitor C6 are representative of the bottom resonator 55. An inductor L7 is representative of a broadside coupling of the top resonator 51 and the middle resonator 53 facilitated by the aperture 52*a* of the inner ground 52. An inductor L8 is representative of a broadside coupling of the middle resonator 53 and the bottom resonator 55 facilitated by the aperture 54*a* of the inner ground 54. A node N4 is representative of the output port 55*a* having an output load represented by a resistor R4 and a conventional impedance transforming network ("ITN") 56*b*.

FIGS. 16–20 illustrate an upper broadside view of a resonating configuration 151 of the top resonator 51 (FIG. 14), a ground configuration 152 of the inner ground 52 (FIG. 14), a resonating configuration 153 of the middle resonator 53 (FIG. 14), a ground configuration 154 of the inner ground 54 (FIG. 14), and a resonating configuration 155 of the bottom resonator 55 (FIG. 14), respectively. The resonating configuration 151 includes a transmission line grounded at one end to develop an inductive portion corresponding to the inductor L4 (FIG. 15) and an open circuited stub with a step in line width to develop a capacitive portion corresponding to the capacitor C4 (FIG. 15). The resonating configuration 151 further includes an input port 151*a* corresponding to the input port 51*a* (FIG. 14), and a pair of vias 151*b* and 151*c* for facilitating a grounding of the inductive portion L4. In this embodiment, the input port 151*a* is a direct-connection tap on the transmission line L4, where the tap location determines the loaded Q of the resonator device. Those having ordinary skill in the art will appreciate other conventional techniques for designing the input port 151*a* of the resonating configuration 151.

The resonating configuration 153 includes a transmission line grounded at one end to develop an inductive portion corresponding to the inductor L5 (FIG. 15) and an open circuited stub with a step in line width to develop a capacitive portion corresponding to the capacitor C5 (FIG. 15). The resonating configuration 153 further includes a pair of vias 153*a* and 153*b* for facilitating a grounding of the inductive portion L5.

The ground configuration 152 includes an aperture 152*a* corresponding to the aperture 52*a* (FIG. 14) and the inductor L7 (FIG. 15). The aperture 152*a* facilitates a coupling of a portion of a lower broadside surface (not shown) of the inductor portion L4 of the resonating configuration 151 and a portion of the upper broadside surface (shown) of the inductor portion L5 of the resonating configuration 153.

The resonating configuration 155 includes a transmission line grounded at one end to develop an inductive portion corresponding to the inductor L5 (FIG. 15) and an open circuited stub to develop a capacitive portion corresponding to the capacitor C5 (FIG. 15). The resonating configuration 155 further includes a pair of vias 155*b* and 155*c* for facilitating a grounding of the inductive portion L6.

The ground configuration 154 includes an aperture 154*a* corresponding to the aperture 54*a* (FIG. 14) and the inductor L8 (FIG. 15). The aperture 154*a* facilitates a coupling of a portion of a lower broadside surface (not shown) of the inductor portion L5 of the resonating configuration 153 and a portion of the upper broadside surface (shown) of the inductor portion L6 of the resonating configuration 155.

In this embodiment, the top ground ML4 (FIG. 14) and the bottom ground ML17 (FIG. 14) preferably have the same dimensions as the ground configuration 152 and the ground configuration 154 with the omission of the aperture 152*a* and the aperture 154*a*, respectively.

Figure 21:
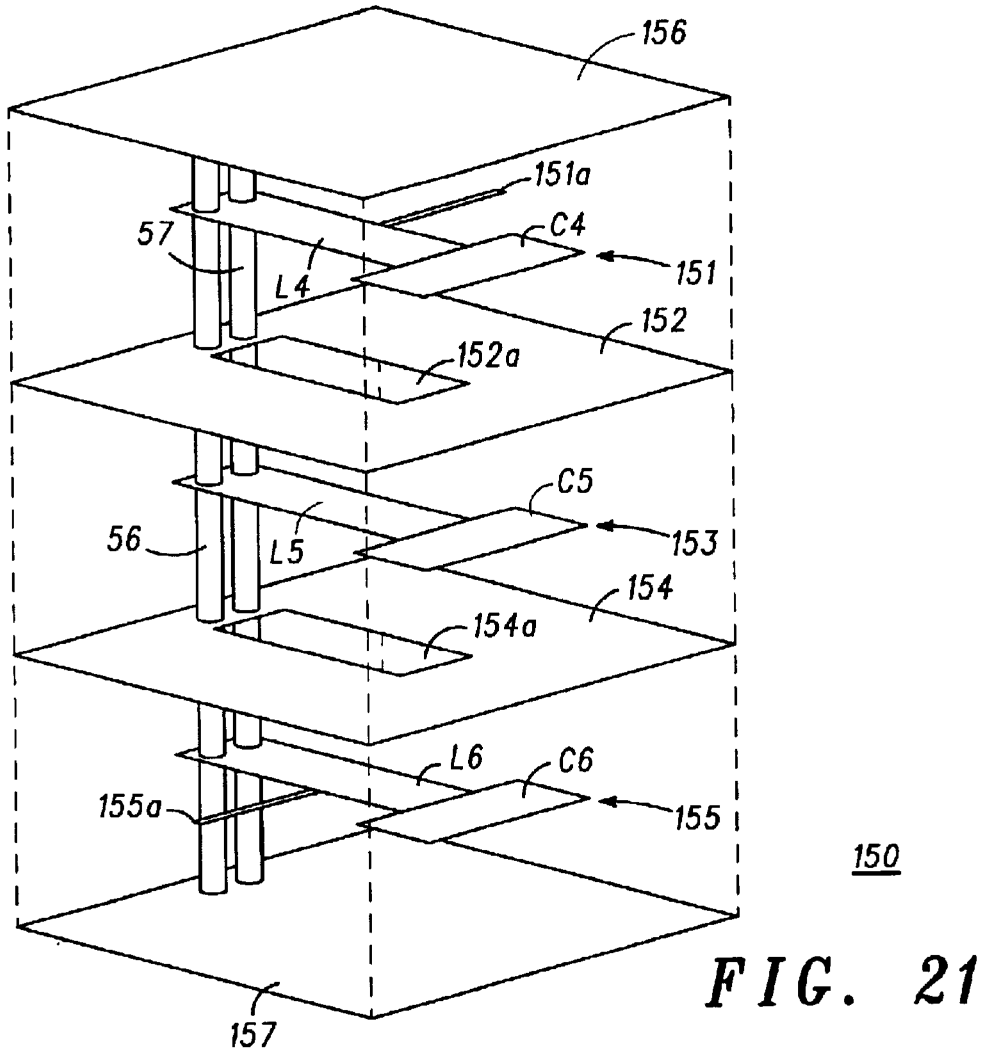
FIG. 21 illustrates a perspective view of the upper broadside view the FIGS. 16–20 resonator device.

FIG. 21 illustrates a three-dimensional rendering of the substrate area 150 of the filter 50 (FIG. 14) of a broadside coupling of the resonating configuration 151 and the resonating configuration 153 via the aperture 152*a*, and of a broadside coupling of the resonating configuration 153 and the resonating configuration 155 via the aperture 154*a*. Specifically, the aperture 152*a* facilitates a coupling of a portion of a lower broadside surface (not shown) of the inductor portion L4 of the resonating configuration 151 and a portion of the upper broadside surface (shown) of the inductor portion L5 of the resonating configuration 153. Additionally, the aperture 154*a* facilitates a coupling of a portion of a lower broadside surface (not shown) of the inductor portion L5 of the resonating configuration 153 and a portion of the upper broadside surface (shown) of the inductor portion L6 of the resonating configuration 155. A via stack 56 connects vias 151*c*, 153*a*, and 155*c*, and a via stack 57 connects vias 151*b*, 153*b*, and 155*b* to thereby short the resonating configurations 151, 153, and 155 to the ground configurations 152 and 154 as well as a configuration 156 of the top ground ML1 (FIG. 2) and a configuration 157 of the bottom ground ML17 (FIG. 2).

Figure 22:
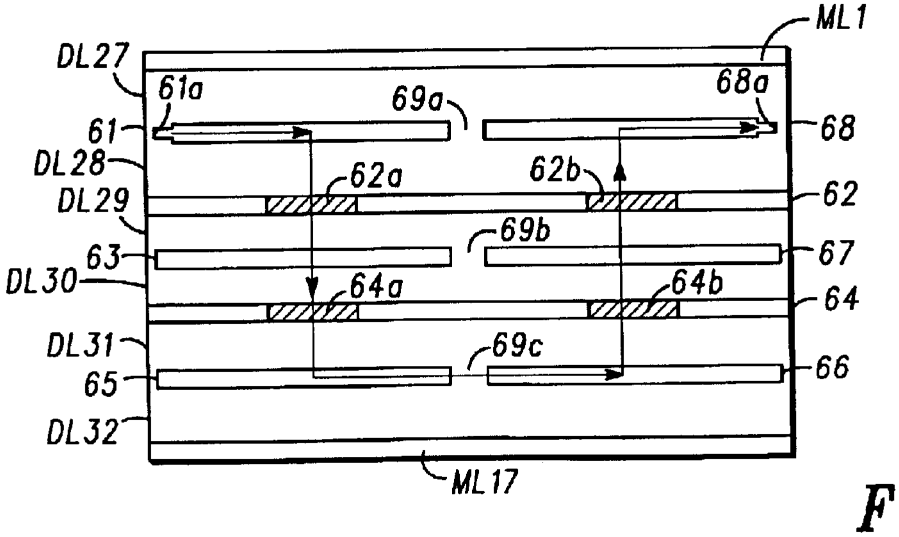
FIG. 22 illustrates a side view of the end edges of various layers of a first embodiment of a $6^{th}$ order filter in accordance with the present invention.

FIG. 22 illustrates a $6^{th}$ order filter 60 of the present invention employing a resonator device including a top resonator 61 having an input port 61*a*, an inner ground 62 having an aperture 62*a* and an aperture 62*b*, a middle resonator 63, an inner ground 64 having an aperture 64*a* and an aperture 64*b*, a bottom resonator 65, a bottom resonator 66, a middle resonator 67, and a top resonator 68 having an output port 68*a*. The top resonator 61 and the top resonator 68 are spaced by a gap 69*a*. The middle resonator 63 and the middle resonator 67 are spaced by a gap 69*b*. The bottom resonator 65 and the bottom resonator 66 are spaced by a gap 69*c*.

As related to FIG. 1, a dielectric layer DL27 corresponds to the dielectric layer DL21 (FIG. 14), a dielectric layer DL28 corresponds to the dielectric layer DL22 (FIG. 14), a dielectric layer DL29 corresponds to the dielectric layer DL23 (FIG. 14), a dielectric layer DL30 corresponds to the dielectric layer DL24 (FIG. 14), a dielectric layer DL31 corresponds to the dielectric layer DL25 (FIG. 14), and a dielectric layer DL32 corresponds to the dielectric layer DL26 (FIG. 14). The metal layer ML4 includes the top resonator 61 and the top resonator 68. The metal layer ML7 includes the inner ground 62. The metal layer ML9 includes the middle resonator 63 and the middle resonator 67. The metal layer ML11 includes the inner ground 64. The metal layer ML14 includes the bottom resonator 65 and the bottom resonator 66. The filter 60 can be fabricated in accordance with various techniques known in the art. In one embodiment, the filter 60 is fabricated in accordance with a multilayer ceramic fabrication technique or a monolithic integrated form fabrication technique involving known refinements, modifications, and enhancements of the filter 60 whereby, as illustrated in FIG. 22, (1) dielectric material from the dielectric layers DL27 and DL28 surround the top resonators 61 and 68, (2) dielectric material from the dielectric layers DL28 and DL29 fill the apertures 62*a* and 62*b* of the inner ground 62, (3) dielectric material from the dielectric layers DL29 and DL30 surround the middle resonators 63 and 67, (4) dielectric material from the dielectric layers DL30 and DL31 fill the apertures 64*a* and 64*b* of the inner ground 44, and (5) dielectric material from the dielectric layers DL31 and DL32 surround the bottom resonators 65 and 66.

A downward facing broadside surface (not shown) of the top resonator 61 and an upward facing broadside surface (not shown) of the middle resonator 63 are coupled through the aperture 62*a* of the inner ground 62. A downward facing broadside surface (not shown) of the middle resonator 63 and an upward facing broadside surface (not shown) of the bottom resonator 65 are coupled through the aperture 64*a* of the inner ground 64. An edge (not shown) of the bottom resonator 65 and an edge (not shown) of the bottom resonator 66 are coupled across the gap 69*c*. An upward facing broadside surface (not shown) of the bottom resonator 66 and a downward facing broadside surface (not shown) of the middle resonator 67 are coupled through the aperture 64*b* of the inner ground 64. An upward facing broadside surface (not shown) of the middle resonator 67 and a downward facing broadside surface (not shown) of the top resonator 68 are coupled through the aperture 62*b* of the inner ground 62. The aforementioned broadside-couplings as well as the edge coupling of the bottom resonators 65 and 66 collectively establish a predominant signal path from the input port 61*a* to the output port 68*a* as indicated by the arrows.

An edge (not shown) of the top resonator 61 and an edge (not shown) of the top resonator 68 are coupled across the gap 69*a*. An edge (not shown) of the middle resonator 63 and an edge (not shown) of the middle resonator 67 are coupled across the gap 69*b*. The aforementioned edge-couplings establish secondary signal paths across the gaps 69*a* and 69*b* (not shown) to thereby facilitate stop-band transmission zeros for the filter 60.

Figure 23:
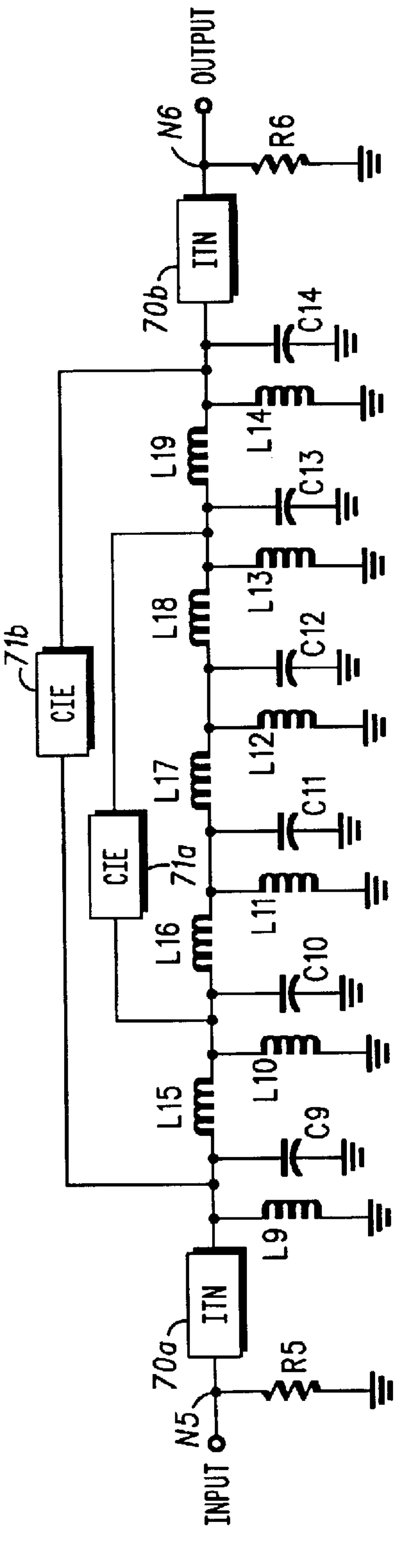
FIG. 23 illustrates a schematic of one embodiment of an equivalent lumped-element circuit forming resonating devices employed within the FIG. 22 filter.

FIG. 23 illustrates an equivalent lumped-element circuit of the filter 60 (FIG. 22). An inductor L9 and a capacitor C9 are representative of the top resonator 61. An inductor L10 and a capacitor C10 are representative of the middle resonator 63. An inductor L11 and a capacitor C11 are representative of the bottom resonator 65. An inductor L12 and a capacitor C12 are representative of the bottom resonator 66. An inductor L13 and a capacitor C13 are representative of the middle resonator 67. An inductor L14 and a capacitor C14 are representative of the top resonator 68.

A node N5 is representative of the input port 61*a* having an input load represented by a resistor R5 and a conventional impedance transforming network ("ITN") 70*a*. An inductor L15 is representative of a broadside coupling of the top resonator 61 and the middle resonator 63 facilitated by the aperture 62*a* of the inner ground 62. An inductor L16 is representative of a broadside coupling of the middle resonator 63 and the bottom resonator 65 facilitated by the aperture 64*a* of the inner ground 64. An inductor L17 is representative of an edge coupling of the bottom resonator 65 and the bottom resonator 66 facilitated by the gap 69*c*. An inductor L18 is representative of a broadside coupling of the bottom resonator 66 and the middle resonator 67 facilitated by the aperture 64*b* of the inner ground 64. An inductor L19 is representative of a broadside coupling of the middle resonator 67 and the top resonator 68 facilitated by the aperture 62*b* of the inner ground 62. A coupling impedance element ("CIE") 71*a* is representative of an edge coupling of the middle resonator 63 and the middle resonator 67 facilitated by the gap 69*b*. A coupling impedance element ("CIE") 71*b* is representative of an edge coupling of the top resonator 61 and the top resonator 68 facilitated by the gap 69*a*. A node N6 is representative of the output port 68*a* having an output load represented by a resistor R6 and a conventional impedance transforming network ("ITN") 70*b*.

Figure 24:
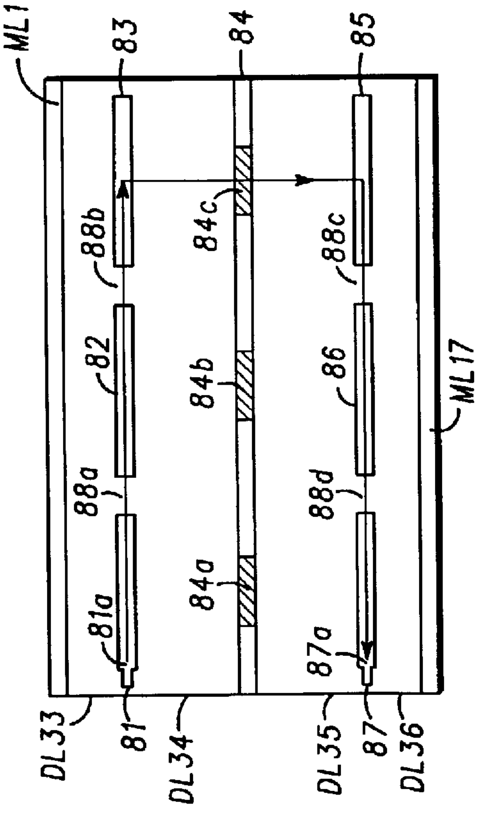
FIG. 24 illustrates a side view of the end edges of various layers of a second embodiment of a $6^{th}$ order filter in accordance with the present invention.

FIG. 24 illustrates a $6^{th}$ order filter 80 of the present invention employing a resonator device including a top resonator 81 having an input port 81*a*, a top resonator 82, a top resonator 83, a bottom resonator 85, a bottom resonator 86, a bottom resonator 87 having an output port 87*a*. The resonator device further includes an inner ground 84 having an aperture 84*a*, an aperture 84*b*, and an aperture 84*c*. The top resonator 81 and the top resonator 82 are spaced by a gap 88*a*. The top resonator 82 and the top resonator 83 are spaced by a gap 88*b*. The bottom resonator 85 and the bottom resonator 86 are spaced by a gap 88*c*. The bottom resonator 86 and the bottom resonator 87 are spaced by a gap 88*d*.

As related to FIG. 1, a dielectric layer DL33 corresponds to the dielectric layer DL17 (FIG. 2), a dielectric layer DL34 corresponds to the dielectric layer DL18 (FIG. 2), a dielectric layer DL35 corresponds to the dielectric layer DL19 (FIG. 2), and a dielectric layer DL36 corresponds to the dielectric layer DL20 (FIG. 2). The metal layer ML5 includes the top resonators 81–83. The metal layer ML9 includes the inner ground 84. The metal layer ML13 includes the bottom resonators 85–87. The filter 80 can be fabricated in accordance with various techniques known in the art. In one embodiment, the filter 80 is fabricated in accordance with a multilayer ceramic fabrication technique or a monolithic integrated form fabrication technique involving known refinements, modifications, and enhancements of the filter 80 whereby, as illustrated in FIG. 24, (1) dielectric material from the dielectric layers DL33 and DL34 surround the top resonators 81–83, (2) dielectric material from the dielectric layers DL34 and DL35 fill the apertures 84*a*–84*c*, and (3) dielectric material from the dielectric layers DL35 and DL36 surround the bottom resonators 85–87.

An edge (not shown) of the top resonator 81 and an edge (not shown) of the top resonator 82 are coupled across the gap 88*a*. An edge (not shown) of the top resonator 82 and an edge (not shown) of the top resonator 83 are coupled across the gap 88*b*. A downward facing broadside surface (not shown) of the top resonator 83 and an upward facing broadside surface (not shown) of the bottom resonator 85 are coupled through the aperture 84*c* of the inner ground 84. An edge (not shown) of the bottom resonator 85 and an edge (not shown) of the bottom resonator 86 are coupled across the gap 88*c*. An edge (not shown) of the bottom resonator 86 and an edge (not shown) of the bottom resonator 87 are coupled across the gap 88*d*. The aforementioned edge couplings as well as the broadside-coupling of the top resonator 83 and the bottom resonator 85 collectively establish a predominant signal path from the input port 81*a* to the output port 87*a* as indicated by the arrows.

A downward facing broadside surface (not shown) of the top resonator 82 and an upward facing broadside surface (not shown) of the bottom resonator 86 are coupled through the aperture 84*b* of the inner ground 84. A downward facing broadside surface (not shown) of the top resonator 81 and an upward facing broadside surface (not shown) of the bottom resonator 87 are coupled through the aperture 84*a* of the inner ground 84. The aforementioned edge-couplings establish secondary signal paths through the apertures 84*a* and 84*b* (not shown) to thereby facilitate stop-band transmission zeros for the filter 80.

Figure 25:
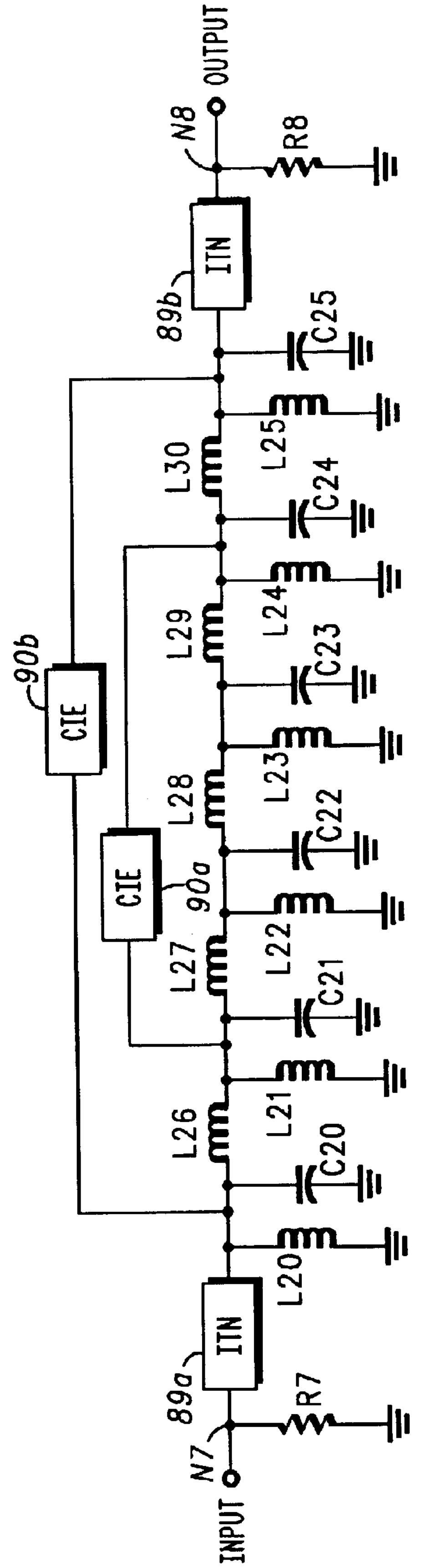
FIG. 25 illustrates a schematic of one embodiment of an equivalent lumped-element circuit forming resonating devices employed within the FIG. 24 filter.

FIG. 25 illustrates an equivalent lumped-element circuit of the filter 80 (FIG. 24). An inductor L20 and a capacitor C20 are representative of the top resonator 81. An inductor L21 and a capacitor C21 are representative of the top resonator 82. An inductor L22 and a capacitor C22 are representative of the top resonator 83. An inductor L23 and a capacitor C23 are representative of the bottom resonator 85. An inductor L24 and a capacitor C24 are representative of the bottom resonator 86. An inductor L25 and a capacitor C25 are representative of the bottom resonator 87.

A node N7 is representative of the input port 81 a having an input load represented by a resistor R7 and a conventional impedance transforming network ("ITN") 89*a*. An inductor L26 is representative of an edge coupling of the top resonator 81 and the top resonator 82 across the gap 88*a*. An inductor L27 is representative of an edge coupling of the top resonator 82 and the top resonator 83 across the gap 88*b*. An inductor L28 is representative of a broadside coupling of the top resonator 83 and the bottom resonator 85 facilitated by the aperture 84*c* of the inner ground 84. An inductor L29 is representative of an edge coupling of the bottom resonator 85 and the bottom resonator 86 across the gap 88*c*. An inductor L30 is representative of an edge coupling of the bottom resonator 86 and the bottom resonator 87 across the gap 88*d*.

A coupling impedance element ("CIE") 90*a* is representative of a broadside coupling of the top resonator 82 and the bottom resonator 86 facilitated by the aperture 84*b* of the inner ground 84. A coupling impedance element ("CIE") 90*b* is representative of a broadside coupling of the top resonator 81 and the bottom resonator 87 facilitated by the aperture 84*a* of the inner ground 84. A node N8 is representative of the output port 87*a* having an output load represented by a resistor R8 and a conventional impedance transforming network ("ITN") 89*b*.

Figure 26:
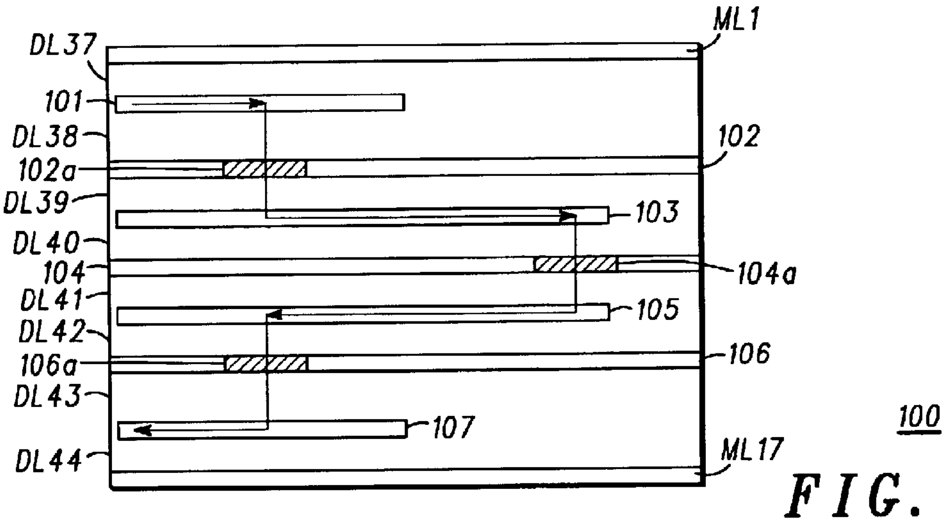
FIG. 26 illustrates a side view of the long-side edges of various layers of a second embodiment of a $2^{nd}$ order filter in accordance the present invention.

FIG. 26 illustrates a long-side view of a $2^{nd}$ order filter 100 of the present invention employing a resonator device including an input line 101, an inner ground 102 having an aperture 102*a*, a top resonator 103, an inner ground 104 having an aperture 104*a*, a bottom resonator 105 having an output port 105*a*, an inner ground 106 having an aperture 106*a*, and an output line 107. As related to FIG. 1, a dielectric layer DL37 consists of the dielectric layers DL1 and DL2 with an omission of the metal layer ML2. The metal layer ML3 includes the input line 101. A dielectric layer DL38 consists of the dielectric layers DL3 and DL4 with an omission of the metal layer ML4. The metal layer ML5 includes the inner ground 102. A dielectric layer DL39 consists of the dielectric layers DL5 and DL6 with an omission of the metal layer ML6. The metal layer ML7 includes the top resonator 103. A dielectric layer DL40 consists of the dielectric layers DL7 and DL8 with an omission of the metal layer ML8. The metal layer ML9 includes the inner ground 104. A dielectric layer DL41 consists of the dielectric layers DL9 and DL10 with an omission of the metal layers ML10. The metal layer ML11 includes the bottom resonator 105. A dielectric layer DL42 consists of the dielectric layers DL11 and DL12 with an omission of the metal layers ML11. The metal layer ML13 includes the ground resonator 106. A dielectric layer DL43 consists of the dielectric layers DL13 and DL14 with an omission of the metal layers ML14. The metal layer ML15 includes the output line 107. A dielectric layer DL44 consists of the dielectric layers DL15 and DL16 with an omission of the metal layers ML16.

The filter 100 can be fabricated from various techniques known in the art. In one embodiment, the filter 100 is fabricated in accordance with a multilayer ceramic fabrication technique or a monolithic integrated form fabrication technique involving known refinements, modifications, and enhancements of the filter 100 whereby, as illustrated in FIG. 26, (1) dielectric material from the dielectric layers DL37 and DL38 surround the input line 101, (2) dielectric material from the dielectric layers DL38 and DL39 fill the aperture 102*a*, (3) dielectric material from the dielectric layers DL39 and DL40 surround the top resonator 103, (4) dielectric material from the dielectric layers DL40 and DL41 fill the aperture 104*a*, (5) dielectric material from the dielectric layers DL41 and DL42 surround the bottom resonator 105, (6) dielectric material from the dielectric layers DL42 and DL43 fill the aperture 106*a*, and (7) dielectric material from the dielectric layers DL43 and DL44 surround the input line 107.

A downward facing broadside surface (not shown) of the input line 101 and an upward facing broadside surface (not shown) of the top resonator 103 are coupled through the aperture 102*a* of the inner ground 102. A downward facing broadside surface (not shown) of the top resonator 103 and an upward facing broadside surface (not shown) of the bottom resonator 105 are coupled through the aperture 104*a* of the inner ground 104. A downward facing broadside surface (not shown) of the top resonator 105 and an upward facing broadside surface (not shown) of the bottom resonator 107 are coupled through the aperture 106*a* of the inner ground 106. The aforementioned broadside-couplings collectively establish a signal path from the input line 101 to the output line 107 as indicated by the arrows.

The area of the filter 100 between the top ground ML1 and the inner ground 102 constitutes a self-shielded stripline environment having the input line 101 therein. The area of the filter 100 between the inner ground 106 and the bottom ground ML17 constitutes an additional self-shielded stripline environment having the output line 107 therein. This arrangement of stripline environments provides an operational isolation of the input line 101 and an operational isolation of the output line 107.

Figure 27:
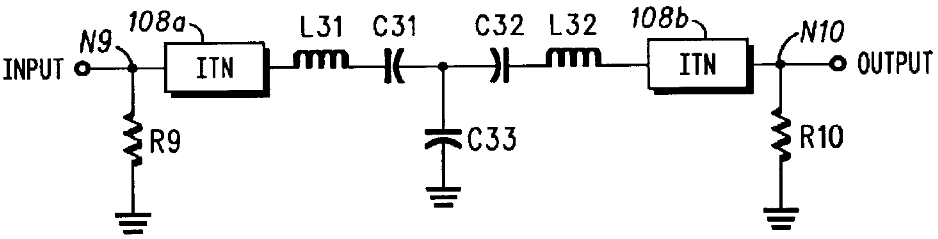
FIG. 27 illustrates a schematic of one embodiment of an equivalent lumped-element circuit forming resonating devices employed within the FIG. 26 filter.
Figure 28:
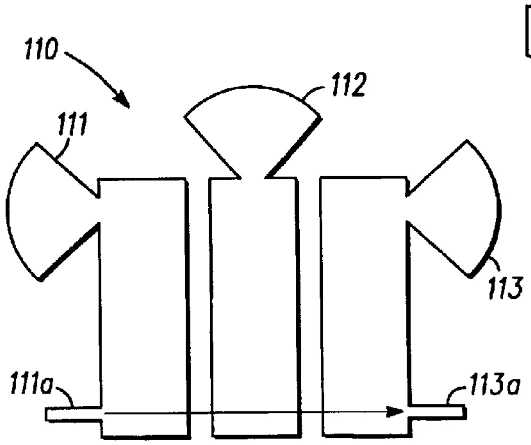
FIG. 28 illustrates a top view of an edge-coupled resonator device known in the art as 'combline'.
Figure 29:
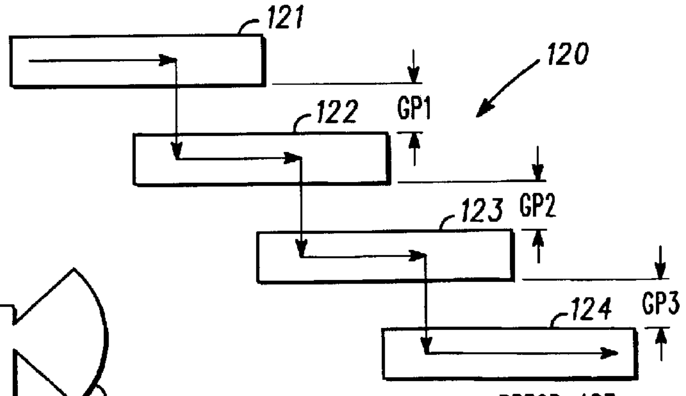
FIG. 29 illustrates a top view of an edge-coupled resonator device known in the art as 'parallel coupled line'.

FIG. 27 illustrates an equivalent lumped-element circuit of the filter 100 (FIG. 26). A node N9 is representative of the input line 101 having an input load represented by a resistor R9. An inductor L31 and a capacitor C31 are representative of the top resonator 103. An inductor L32 and a capacitor C32 are representative of the bottom resonator 105. An impedance transforming network ("ITN") 108*a* is representative of a broadside coupling of the input line 101 and the top resonator 103 facilitated by the aperture 102_a_ within the inner ground 102. A capacitor C33 is representative of a broadside coupling of the top resonator 103 and the bottom resonator 105 facilitated by the aperture 104_a_ within the inner ground 104. An impedance transforming network ("ITN") 108_b_ is representative of a broadside coupling of the bottom resonator 105 and the output line 107 facilitated by the aperture 106_a_ within the inner ground 106. A node N10 is representative of the output line 107 having an output load represented by a resistor R10.

From the preceding description herein of the several embodiments of the present invention as illustrated in FIGS. 2–27, those having ordinary skill in the art will now know how to apply the principles of aperture coupling of adjacent and non-adjacent resonators to other filter configurations, such as, for example, an interdigital filter configuration and a hairpin filter configuration.

The dimensions of a dielectric layer, a resonator, a ground, and a ground aperture are primarily dependent upon the dielectric material properties and an operational specification of a filter in accordance with the present invention, and a detailed discussion of such dimensions was therefore omitted. However, one skilled in the art will appreciate a proper dimensioning of a dielectric layer, a resonator, a ground, and a ground aperture to achieve the operational specification of the filter.

Those having ordinary skill in the art will recognize various conventional techniques that can be employed in establishing a communication with an input port/line and an output port/line of the present invention.

Each illustration herein of a broadside coupling of a pair of resonators is shown with a vertical alignment of the resonators relative to the aperture between the resonators. Alternatively, a broadside coupling in accordance with the present invention can be based on a vertical staggering of the resonators relative to the aperture between the resonators.

Each illustration herein of an edge coupling of a pair of resonators is shown with a horizontal alignment of the resonators relative to the gap between the resonators. Alternatively, an edge coupling in accordance with the present invention can be based on a horizontal staggering of the resonators relative to the gap between the resonators.

Those having ordinary skill in the art will appreciate various benefits of the present invention from the preceding description herein of the several embodiments of the present invention as illustrated in FIGS. 2–27. One benefit is a filter in accordance with the present invention facilitates a fabrication of the filter within a minimal substrate area. A second benefit is a filter in accordance with the present invention facilitates a significant operational tolerance to an inadvertent staggering or misalignment of the resonators due to fabrication errors. A third benefit is a filter in accordance with the present invention that can be strategically incorporated within a wide range of devices, such as, for example, a transceiver to implement front-end filters within the multilayer ceramic.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A filter, comprising:

a plurality of metal layers and a plurality of dielectric layers arranged in a vertically stacked topology;

wherein a first metal layer of said plurality of metal layers includes a first resonator and a second resonator;

wherein a second metal layer of said plurality of metal layers includes a third resonator and a fourth resonator; and wherein a predominate signal path of said filter is established by a first broadside-coupling of said first resonator and said third resonator, a first edge-coupling of said third resonator and said fourth resonator, and a second broadside-coupling of said second resonator and said fourth resonator.

2. The filter of claim 1, wherein a third metal layer of said plurality of metal layers includes an inner ground conductor having a first aperture for facilitating the first broadside-coupling of said first resonator and said third resonator, and a second aperture for facilitating the second broadside-coupling of said second resonator and said fourth resonator; and wherein a gap in said second metal layer facilitates the first edge-coupling of said third resonator and said fourth resonator.

3. The filter of claim 1, wherein a secondary signal path of said filter is established by a second edge-coupling of said first resonator and said second resonator.

4. The filter of claim 3, wherein a gap in said first metal layer facilitates the second edge-coupling of said first resonator and said second resonator.

5. The filter of claim 1, wherein a third metal layer of said plurality of metal layers includes a fifth resonator and a sixth resonator; and wherein said predominate signal path of said filter is further established by a third broadside coupling of said first resonator and said fifth resonator, and a fourth broadside coupling of said second resonator and said sixth resonator.

6. The filter of claim 5, wherein a fourth metal layer of said plurality of metal layers includes an inner ground conductor having a first aperture for facilitating the third broadside-coupling of said first resonator and said fifth resonator, and a second aperture for facilitating the fourth broadside-coupling of said second resonator and said sixth resonator.

7. The filter of claim 5, wherein a secondary signal path of said filter is established by a second edge-coupling of said first resonator and said second resonator.

8. The filter of claim 5, wherein a secondary signal path of said filter is established by a second edge-coupling of said fifth resonator and said sixth resonator.

9. The filter of claim 5, wherein a first secondary signal path of said filter is established by a second edge-coupling of said first resonator and said second resonator; and wherein a second secondary signal path of said filter is established by a third edge-coupling of said fifth resonator and said sixth resonator.

10. The filter of claim 9, wherein a first gap in said first metal layer facilitates the second edge-coupling of said first resonator and said second resonator; and wherein a second gap in said third metal layer facilitates the third edge-coupling of said fifth resonator and said sixth resonator.

11. A filter, comprising:

a plurality of metal layers and a plurality of dielectric layers arranged in a vertically stacked topology;

wherein a first metal layer of said plurality of metal layers includes a first resonator and a second resonator;

wherein a second metal layer of said plurality of metal layers includes a third resonator and a fourth resonator; and wherein a predominate signal path of said filter is established by a first edge-coupling of said first resonator and said second resonator, a first broadside-coupling of said second resonator and said third resonator, and a second edge-coupling of said third resonator and said fourth resonator.

12. The filter of claim 11, wherein a third metal layer of said plurality of metal layers includes an inner ground conductor having an aperture for facilitating the first broadside-coupling of said second resonator and said third resonator;

wherein a first gap in said first metal layer facilitates the first edge-coupling of said first resonator and said second resonator; and wherein a second gap in said second metal layer facilitates the second edge-coupling of said third resonator and said fourth resonator.

13. The filter of claim 11, wherein a secondary signal path of said filter is established by a second broadside-coupling of said first resonator and said fourth resonator.

14. The filter of claim 11, wherein said first metal layer further includes a fifth resonator;

wherein said second metal layer further includes a sixth resonator; and wherein said predominate signal path of said filter is further established by a third edge-coupling of said first resonator and said fifth resonator, and a fourth edge-coupling of said fourth resonator and said sixth resonator.

15. The filter of claim 14, wherein a third gap in said first metal layer facilitates the third edge-coupling of said first resonator and said sixth resonator; and wherein a fourth gap in said second metal layer facilitates the fourth edge-coupling of said fourth resonator and said sixth resonator.

16. The filter of claim 14, wherein a secondary signal path of said filter is established by a second broad-side coupling of said first resonator and said fourth resonator.

17. The filter of claim 14, wherein a secondary signal path of said filter is established by a second broadside-coupling of said fifth resonator and said sixth resonator.

18. The filter of claim 14, wherein a secondary signal path of said filter is established by a second broad-side coupling of said first resonator and said fourth resonator; and wherein a secondary signal path of said filter is established by a third broadside-coupling of said fifth resonator and said sixth resonator.

19. The filter of claim 18, wherein a third metal layer of said plurality of metal layers includes an inner ground conductor having first aperture for facilitating the first broadside-coupling of said second resonator and said third resonator, a second aperture for facilitating the second broadside-coupling of said first resonator and said fourth resonator, and a third aperture for facilitating the third broadside-coupling of said fifth resonator and said sixth resonator.

* * * * *